US009269838B2

(12) United States Patent
Karim et al.

(10) Patent No.: US 9,269,838 B2
(45) Date of Patent: Feb. 23, 2016

(54) RADIATION DETECTOR SYSTEM AND METHOD OF MANUFACTURE

(71) Applicants: Karim S. Karim, Waterloo (CA); Shiva Abbaszadeh, Waterloo (CA)

(72) Inventors: Karim S. Karim, Waterloo (CA); Shiva Abbaszadeh, Waterloo (CA)

(*) Notice: Subject to any disclaimer, the term of this patent is extended or adjusted under 35 U.S.C. 154(b) by 10 days.

(21) Appl. No.: 14/363,859

(22) PCT Filed: Dec. 7, 2012

(86) PCT No.: PCT/CA2012/050881
§ 371 (c)(1),
(2) Date: Jun. 9, 2014

(87) PCT Pub. No.: WO2013/082721
PCT Pub. Date: Jun. 13, 2013

(65) Prior Publication Data
US 2014/0346631 A1    Nov. 27, 2014

Related U.S. Application Data

(60) Provisional application No. 61/630,338, filed on Dec. 9, 2011.

(51) Int. Cl.
*H01L 31/18* (2006.01)
*H01L 31/08* (2006.01)
*H01L 31/02* (2006.01)
*H01L 31/0216* (2014.01)

(52) U.S. Cl.
CPC ........ *H01L 31/02164* (2013.01); *H01L 31/085* (2013.01); *H01L 31/18* (2013.01)

(58) Field of Classification Search
CPC .. H01L 31/02164; H01L 31/085; H01L 31/18
See application file for complete search history.

(56) References Cited

U.S. PATENT DOCUMENTS

| 4,233,514 A | 11/1980 | Kingsley |
| 5,880,472 A | 3/1999 | Polischuk et al. |
| 7,256,402 B1 | 8/2007 | Lee |
| 2004/0178426 A1 | 9/2004 | Melekhov et al. |
| 2007/0108398 A1 | 5/2007 | Imai |
| 2009/0026381 A1 | 1/2009 | Iwazaki |
| 2009/0026382 A1 | 1/2009 | Sakamoto et al. |
| 2009/0246402 A1 | 10/2009 | Mataki et al. |

FOREIGN PATENT DOCUMENTS

| JP | 2006156555 A | * | 6/2006 |
| WO | WO 2010121386 A1 | * | 10/2010 |

OTHER PUBLICATIONS

Machine translation of JP-2006156555-A.*
Canadian Intellectual Propery Office As International Searching Authority, International Search Report and Written Opinion for PCT Patent Appln No. PCT/CA2012/050881, Feb. 26, 2013.

* cited by examiner

*Primary Examiner* — Mark R Gaworecki
(74) *Attorney, Agent, or Firm* — Gowling Lafleur Henderson LLP; Jeffrey W. Wong (57) ABSTRACT

A high electric field radiation detector includes a first and second electrode, a radiation detector layer and a soft polymer layer. The soft polymer detector layer located below the radiation detector layer and in contact with at least the first electrode.

25 Claims, 7 Drawing Sheets

RADIATION DETECTOR SYSTEM AND METHOD OF MANUFACTURE

CROSS REFERENCE TO RELATED APPLICATIONS

This application claims the benefit of priority of U.S. Provisional Patent Application No. 61/630,338 filed Dec. 9, 2011, which is incorporated herein by reference in its entirety.

FIELD

The present disclosure relates generally to radiation detectors and photodetectors. More particularly, the present disclosure relates to a radiation detector system and method of manufacture.

BACKGROUND

Conventional selenium detectors include using an insulating detector top contact and using multi-layer inorganic blocking contact devices. However, neither approach yields photo-gain nor do they use a blocking layer on the bottom of the detector as an anti-crystallization layer. Use of anti-crystallization layers is reported in U.S. Pat. No. 7,649,177 which describes using an inorganic conductive arsenic doped selenium layer.

Conventional avalanche selenium detectors include vacuum tube readout devices and devices using a resistive interface layer based on cellulose. The disadvantage with the former is the need for a high vacuum in order for the pixel to be read out. The disadvantage with the latter is the process complexity associated with multiple blocking layers and lower large area reliability.

In conventional systems, soft polymer layers have been used as top blocking contacts to reduce leakage currents. However, soft polymer layers have, in conventional devices, contributed to charge buildup and lower reliability.

Conventional lateral amorphous-selenium (a-Se) metal-semiconductor-metal (MSM) photodetectors may be used in indirect conversion X-ray imaging applications due to their ease of fabrication and higher speeds when compared to direct conversion a-Se systems. Conventional indirect conversion X-ray imagers couple a visible light-emitting scintillator to an optical detector such as an amorphous-silicon photodiode. Lateral a-Se indirect conversion devices may be individual detectors integrated with a thin-film transistor (TFT) imaging array for use in indirect conversion X-ray imaging. A limitation with conventional lateral detectors is a significant increase in dark current with an increasing applied bias. High biases are desirable to provide a higher photogeneration efficiency and carrier mobility that results from increasing the electric field within the a-Se layer. High dark current leads to a smaller ratio between the photo and dark current at high biases and ultimately limits the minimum detectable light level affecting the dynamic range.

In conventional vertical a-Se X-ray detectors different strategies have been used to mitigate injection of charge into the bulk photodetector. For example, p- and n-like layers are used to block holes and electrons, respectively. However, there may be complexities associated with depositing low-leakage p- or n-like blocking layers. In another conventional design, a single insulating blocking contact near the positively biased electrode is used to block holes only. For detecting visible light photons, vertical a-Se devices may have disadvantages as light must pass through either the top or bottom contact and a blocking layer. As such, there may be a loss of an optical signal compared to lateral photoconductors unless specialized contact layers, like beryllium or transparent conductive oxides, are used.

It is, therefore, desirable to provide faster device or photodetector operation for emerging high speed X-ray imaging applications, higher image quality with amorphous selenium photoconductor imagers, ease of fabrication by using same manufacturing process, and low cost impact.

It is also desirable to provide a photodetector with high reliability, photogain, high responsivity, low dark current, and/or a high speed of operation.

SUMMARY

It is an object of the present disclosure to obviate or mitigate at least one disadvantage of previous systems.

In a first aspect, the present disclosure is directed at high gain photodetectors having a radiation detecting layer. In one embodiment, the disclosed apparatus includes an amorphous material photodetector with a soft polymer layer (such as a commercial polyimide film). The soft polymer layer is below the amorphous material layer and may act as an anti-crystallization layer or as a blocking contact to reduce leakage current or both. The polymer layer, such as one made out of a soft organic material, reduces the strain between the amorphous material of the photodetector and a substrate layer leading to better reliability in the form of reduced recrystallization. The soft polymer layer may also allow for the deposition of amorphous material to be reliably deposited on various substrates or a bottom electrode made from glass, silicon, steel, or plastic to provide mechanically flexible, high performance photo-detectors. Another advantage of the disclosure is that charge build-up may be reduced during operation of the photodetector.

In one embodiment, for a photodetector having the soft polymer layer, when used with an amorphous selenium layer, yields low dark currents and avalanche type behavior at high electric fields. Soft polymers are commonly used in the semiconductor industry and may be scalable and amenable to the manufacture of large area electronics.

In further aspect, the present disclosure provides using a soft polymer layer as a base layer to reduce crystallization, increase reliability, and lower leakage current levels.

In further aspect, the present disclosure provides using a soft polymer layer as a foundation layer to build high gain photodetectors including avalanche devices.

The present disclosure describes a photodetector having an increase in stability or a photodetector which reduces or eliminates crystallization at certain operating conditions. The present disclosure also describes a photodetector when manufactured with pure amorphous selenium allows for increasing electric field to be realized while maintaining the dark current low. The present disclosure also describes a photodetector which may operate in avalanche situation.

Each of the advantages disclosed above may be attributed to the presence of the soft polymer layer, or polyimide layer below the radiation detecting layer.

In an aspect, the present disclosure provides a high electric field radiation detector including a first electrode, a second electrode, a radiation detecting layer, and a soft polymer layer below the radiation detecting layer and in contact with at least the first electrode.

In another aspect, the present disclosure provides a first method of manufacturing a radiation detector. The method includes obtaining a first electrode, depositing a soft polymer layer on the first electrode, depositing a radiation detecting layer above the soft polymer layer, and depositing a second electrode above the amorphous material layer.

In a further aspect, the present disclosure provides a second method of manufacturing a radiation detector. The method includes obtaining a first electrode and a second electrode, depositing a soft polymer layer on the first electrode and the second electrode, and depositing a radiation detecting layer above the soft polymer layer.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides photodetector devices and methods for manufacturing photodetectors having a soft polymer layer. In a particular embodiment, the present disclosure provides a high gain photodetector and a method for manufacturing high gain photodetectors having a soft polymer layer. High gain is considered to be achieved at an electric field above 10 V/μm.

High gain photodetectors are used in various indirect conversion medical X-ray imaging applications that require single photon sensitivity. For example, high gain photo detectors may be used in computed tomography, fluoroscopy, positron emission tomography (PET), single photon emission computed tomography (SPECT), and high sensitivity optical imaging applications in the life sciences (e.g., microscopy). In addition, high gain photodetectors may be used in photon counting applications in the medical, security and industrial imaging fields. Other areas of photodetector use may include medical X-ray imaging, industrial X-ray imaging, life science research and biomedical engineering applications, astronomy and space applications, and military and security applications.

Figure 1:
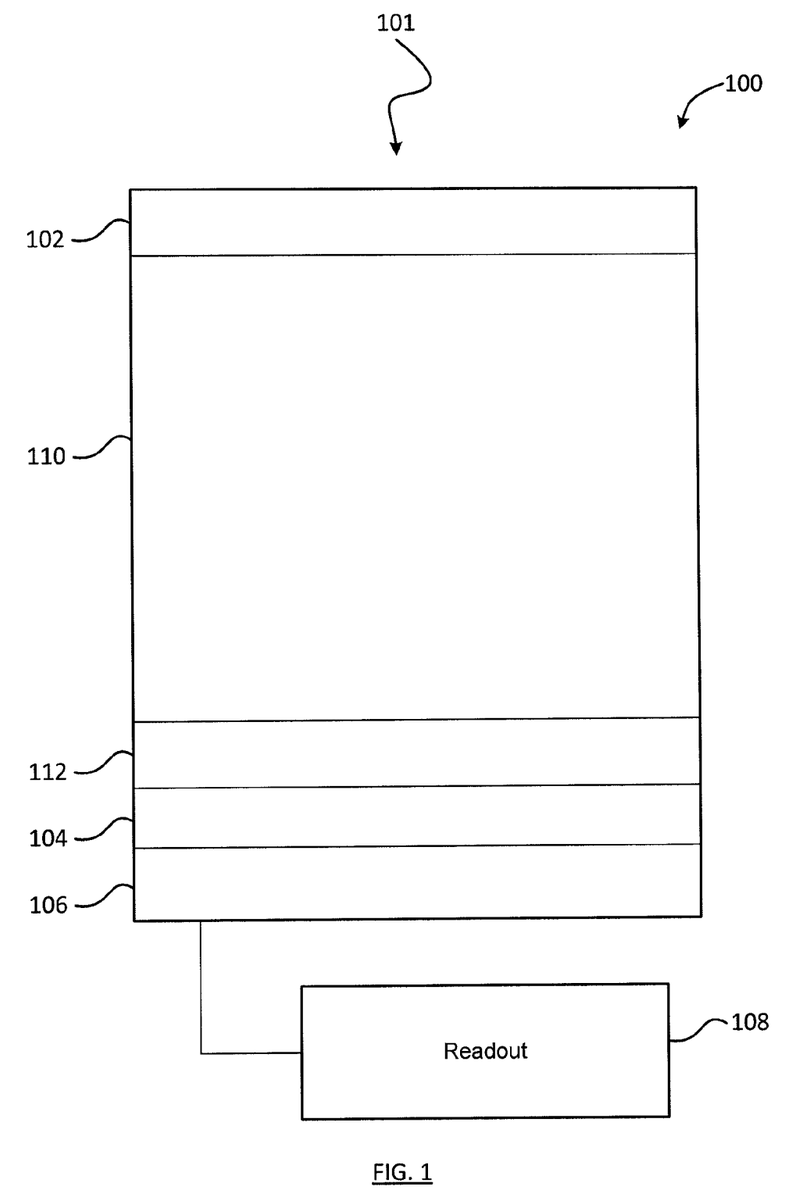
FIG. 1 is a diagram of a photodetector, in accordance with a first embodiment.

Turning to FIG. 1, a schematic diagram of a radiation detector such as a photodetector 100 in accordance with a first embodiment is shown. Although shown in a vertical direction, the photodetector 100 may be either vertical or lateral. In the current disclosure, the descriptor words "top" and "bottom" are used to describe the vertical photodetector. One skilled in the art would recognize and understand that the term "top" simply refers to the electrode through which the photons get absorbed in the photosensitive layer. In a lateral configuration, there is not a top contact but rather both contacts are patterned in the same x-y plane and photons (incident light) reach the radiation detecting layer before reaching the electrodes. In the current disclosure, the descriptor words "above" and "below" are used to describe the orientation with respect to receiving a signal. In either a vertical or lateral configuration, a layer above another layer is subject to the incident light first.

The photodetector 100 is subject to a signal in the direction of arrow 101. The photodetector 100 includes a first (bottom) electrode 104 (e.g. an anode) and a second (top) electrode 102 (e.g. a cathode). The bottom electrode 104 is deposited on a substrate layer 106 which may be any one of a thin film transistor (TFT) array, a complementary metal-oxide semiconductor (CMOS) transistor array, a plastic layer, a steel layer, or a glass layer. The substrate layer 106 is operatively connected to a readout device 108 to detect the electrical charge developed by the photodetector 100. The readout device 108 may then communicate with a processor (not shown) to display the results.

In certain embodiments, the substrate layer 106 comprises a less rigid substrate to reduce the magnitude of irreversible photo darkening (PD). PD is caused by photo-induced conversion of some structural units from a ground state configuration into a metastable state that increases the level of disorder, broadens the band tails, and thus increases absorption. A less rigid substrate creates partial strain relaxation at the substrate layer interface and a decrease in the concentration of structural units. The selection of the substrate layer 106 may affect the magnitude of PD such that use of a more rigid substrate layer 106 may results in a stronger PD.

The photodetector 100 further includes a radiation detecting layer 110 sandwiched between the top electrode 102 and the bottom electrode 104. In certain embodiments, the radiation detecting layer 110 comprises amorphous selenium (a-Se) while in other embodiments, the radiation detecting layer 110 may be amorphous silicon, mercuric iodide, lead oxide, or an organic semiconductor.

The selection of the radiation detecting layer 110 in the photodetector 100 may be based on the applications that the photodetector may be used for such as, but not limited, indirect conversion X-ray imaging applications which may provide high quantum efficiency, low dark current, large area low capital cost fabrication infrastructure or the possibility of gain. In some embodiments, avalanche multiplication occurs in a photodetector with a soft polymer layer and an amorphous material layer 110 of a-Se layer and also provides high gain, at electric fields of approximately 70-80 V/μm depending on the thickness of the a-Se layer 110.

The photodetector 100 further includes a soft polymer layer 112 between the bottom electrode 104 and the radiation detecting layer 110. In certain embodiments, the soft polymer layer 112 is a soft, organic material layer or may be a polyimide, for example a commercial polyimide. The interface between the soft polymer layer 112 and the radiation detecting layer 110 is preferably clean with little or no surface defects. This property is provided by the fact that the soft polymer layer is able to fill in holes (seen as flaws or defects on the surface) so that there is a smooth transition between the radiation detecting 110 and the bottom electrode 104. In operation, the soft polymer layer 112 allows carriers to pass through at high electric charges.

The soft polymer layer 112 may be deposited on the bottom electrode 104 by spin coating, thermal evaporating, ink-jetting, or spraying. Other methods for depositing the soft polymer layer 112 to the bottom electrode 104 may be used with the requirement of providing uniformity of the soft polymer surface.

An advantage of the current apparatus is that the soft polymer layer 112 provides a reduction in the dark current of the photodetector (when the radiation detecting layer is a-Se) to current density levels of less than 10 pA/mm2 up to an electric field strength of 50 V/mm. The use of the deposited soft polymer layer 112 may also provide for low leakage, reliable and high gain device operation.

In conventional systems, polyimide layers have been considered to be insulators in low electric fields, however, the inventors have determined that the polyimide layer 112 acts differently at high voltages and provides benefits which were previously unknown.

Dark current in the a-Se layer 110 is dominated by the injection of holes which provides for the use of the blocking layer 112 for high performance imaging applications. Advantageously, polyimide is widely used in the semiconductor industry and has a low-k inter-level dielectric. Polyimide may also reduce dark current while improving the signal to noise ratio for lateral a-Se metal-semiconductor-metal photodetectors.

As the magnitude of the irreversible PD effect is proportional to the number of structural units which can be converted into a metastable state and provide the irreversible PD, this effect is reduced for a-Se layer 110 when connected with the soft polymer layer 112.

Low dark-current levels for the photodetector 100 are on par with conventional a-Se photodetectors but when the photodetector of the current disclosure is used with electric fields higher than those used in conventional vertical a-Se photodetectors (10 V/μm), improvements are available. The lower dark current may also increase the photo-to-dark-current ratio and consequently yield a higher dynamic range. The photodetector 100 may be compatible with the a-Si TFT fabrication process, allowing for simple integration into large-area indirect conversion X-ray imaging devices.

A photo-to-dark-current ratio of a device without the soft polymer blocking layer 112 is smaller than that of the device 100 with the soft polymer blocking layer 112. The use of the soft polymer blocking layer 112 in the device 100 may also allow for lower levels of light intensity to be detected. With the soft polymer blocking layer 112 a signal is clearly distinguishable from the dark-current level of approximately $10^{-11}$ A/mm$^2$.

As photogeneration efficiency inside the a-Se layer 110 is field dependent (it increases with increasing field), higher fields within the a-Se layer are possible and possibly more desirable. Another advantage of the current photodetector is that higher electric fields are possible using the soft polymer blocking layer 112 while maintaining a reasonably low dark current.

In contrast to conventional devices that use hydrogenated amorphous silicon p-i-n photodetectors for indirect conversion digital imaging, the a-Se device 100 along with the polymer layer 112 is demonstrated to have a photogain of approximately four (4). A small photogain (e.g. 2) is valuable to improve conventional detector performance for light starved digital X-ray imaging applications to lower patient X-ray dose (such as in pediatric imaging or real-time X-ray fluoroscopy applications).

In an embodiment, the photodetector 100 increases reliability over conventional amorphous selenium detectors. The presence of the soft polymer layer 112 as a base layer on the bottom of the amorphous material (a-Se) layer 110 improves reliability and immunity to crystallization. Crystallization may occur where there is inadequate surface contact and where there are photo-induced defects—exposure due to light after time. Moreover, benefits of the soft polymer layer 112 arise at high voltages with high electric fields generated at certain voltages.

The polymer layer 112 acts to reduce the intrinsic stress at the interface of the amorphous material layer 110 and the substrate layer 106 and reduces or prevents the initial nucleation of the trigonal selenium, thus inhibiting the photo-induced crystallization (PiC).

PiC and PD in the amorphous material layer 110 may degrade photodetector response. The disclosed polyimide-buffered photodetector 100 may reduce the induction of PiC. Added stability may be derived from the polyimide blocking layer 112 by darkening less and returning further transparency than unbuffered samples.

The soft polymer layer 112 may allow for the application of a large electric field without the device entering breakdown mode. The high gain photodetector 100 maintains low dark current while exhibiting a gain of greater than one at high electric fields.

Figure 2:
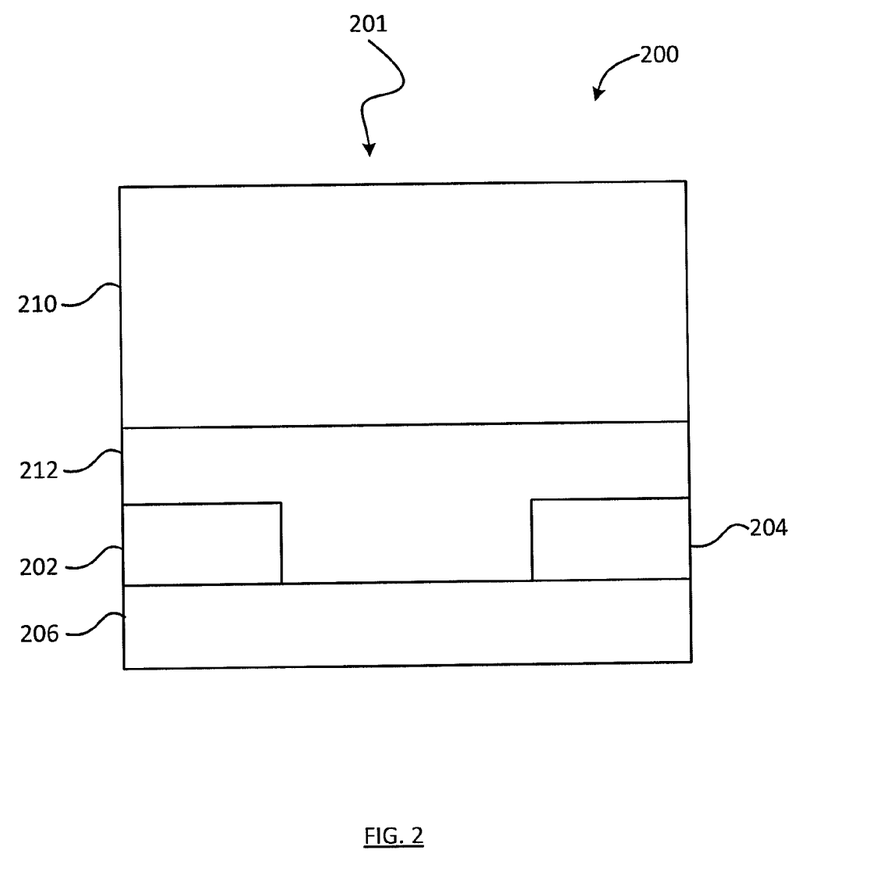
FIG. 2 is a diagram of a lateral photodetector, in accordance with a further embodiment.

Turning to FIG. 2, a schematic diagram of a lateral photodetector 200 in accordance with a further embodiment is shown. The lateral photodetector 200 is subject to a photon signal 201 (such as incident light). The lateral photodetector includes an interdigitated comb structure with a space of, for example, 5 μm between electrodes 202, 204. The lateral photodetector 200 also includes a radiation detecting layer 210, such as an a-Se layer 210 with a thickness of 2 μm. The lateral photodetector 200 also includes a soft polymer layer 212 that is, for example, 1 μm thick. The electrodes may be manufactured from chromium having a width of 10 μm and being 1000 μm long. In an embodiment, there are 34 comb "fingers" on one side of the comb structure and 33 fingers on the other side, making 66 lateral devices over an area of 1×1 mm$^2$. The electrodes 202, 204 and soft polymer layer are on a substrate layer 206. In use, there is a significant electric field in the a-Se layer 210 of the device where the photogeneration of the carriers takes place.

Figure 3:
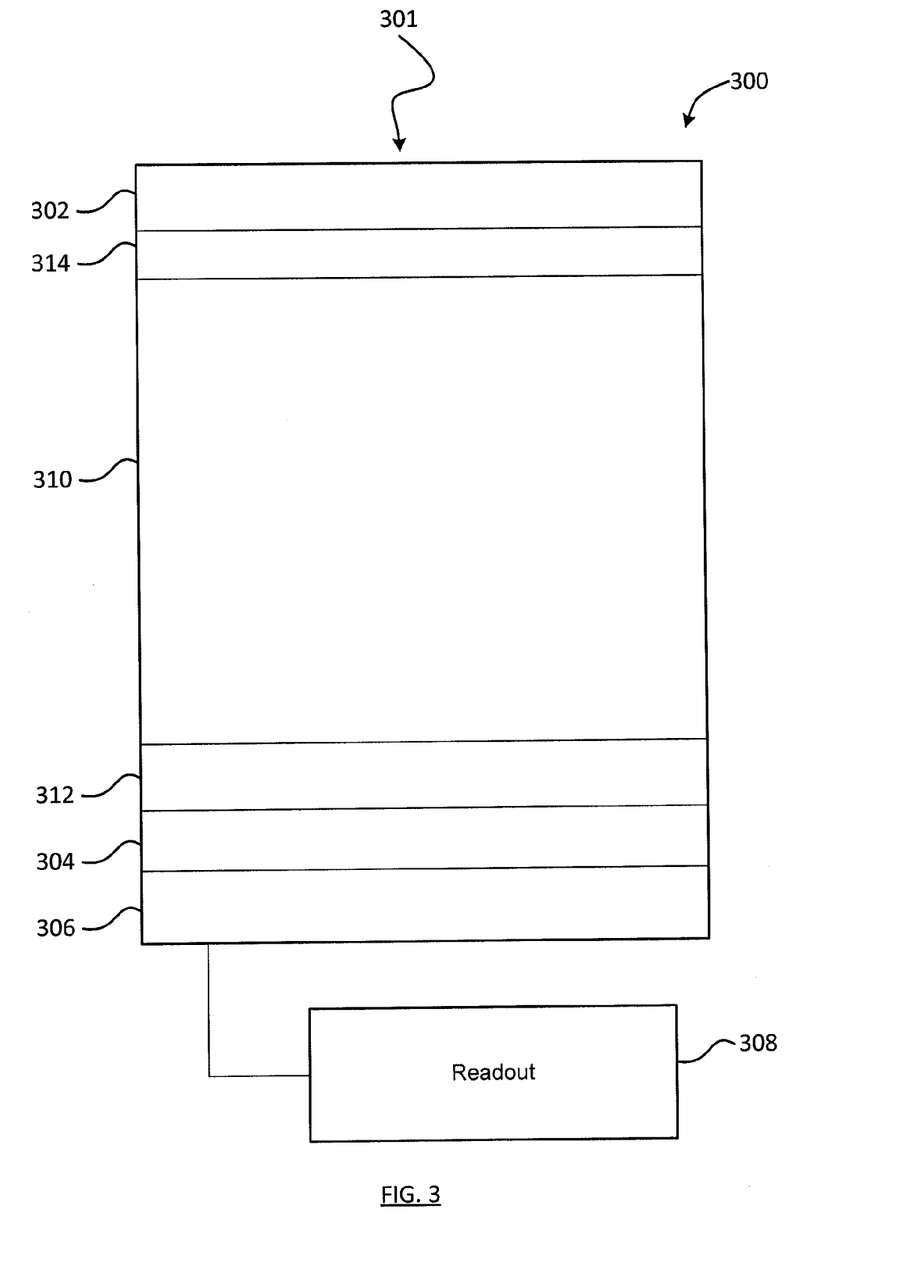
FIG. 3 is a diagram of a photodetector, in accordance with a second embodiment.

FIG. 3 illustrates a photodetector 300, in accordance with a second embodiment. The photodetector 300 is similar to that of photodetector 100 except the photodetector 300 includes a blocking layer 314 in addition to soft polymer layer 312. The photodetector 300 is subject to a photon signal 301. The top blocking layer 314 may comprise an organic material such as perylenetetracarboxylic bisbenzimidazole (PTCBI). In a variant embodiment, the top blocking layer 314 may comprise titanium dioxide (TiO2) or cerium oxide (CeO2). The blocking layer 314 is thermally evaporated or spin coated on a radiation detecting layer 310 and beneath or adjacent a top electrode 302. The blocking layer 314 allows for a further increase in electric field strength for the photodetector. As with photodetector 100, the soft polymer layer, which may also be seen as another blocking layer, 312 is spin coated to a bottom electrode 304 on a substrate layer 306 and operatively connected to a readout device 308.

The top blocking layer 314 may increase the effective quantum efficiency (EQE) of the photodetector 300 as it reduces or prevents injection of carrier from biasing electrodes. In certain embodiments, the photodetector 300 with the blocking layer 314 provides twice the current density and four times the electric field strength, as compared to a photodetector without the blocking layer 314. Where higher electric fields are desirable, it may be desirable to have the blocking layer 314 between the top electrode and the a-Se layer 310.

Figure 4:
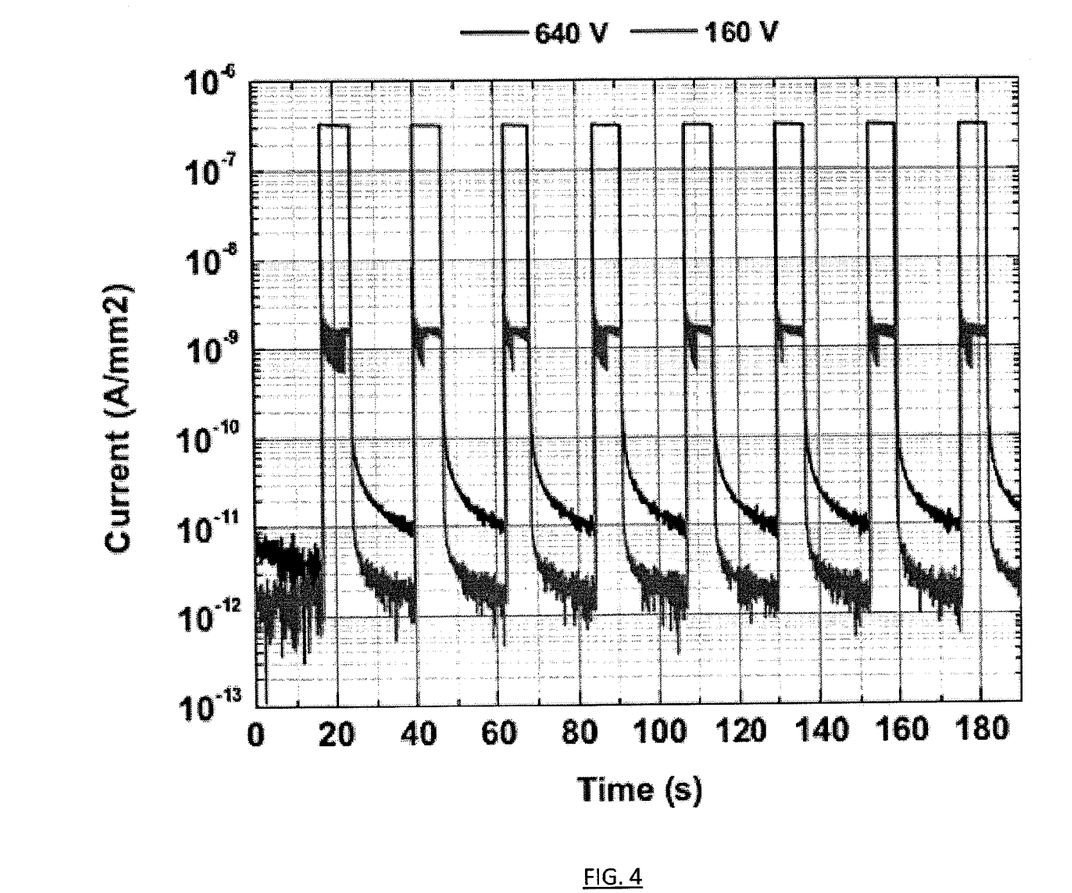
FIG. 4 is graph of photo current for a photo detector with a soft polymer layer.

A device, or photodetector, with the soft polymer layer 112, in the form of a polyimide layer, such described with reference to FIG. 1, was tested using consecutive light pulses and the response is shown in FIG. 4 for different bias voltages. As can be seen, the photocurrent is quite stable over time, suggesting that charge accumulation does not significantly impact the internal field within the amorphous material layer 110.

Figure 5:
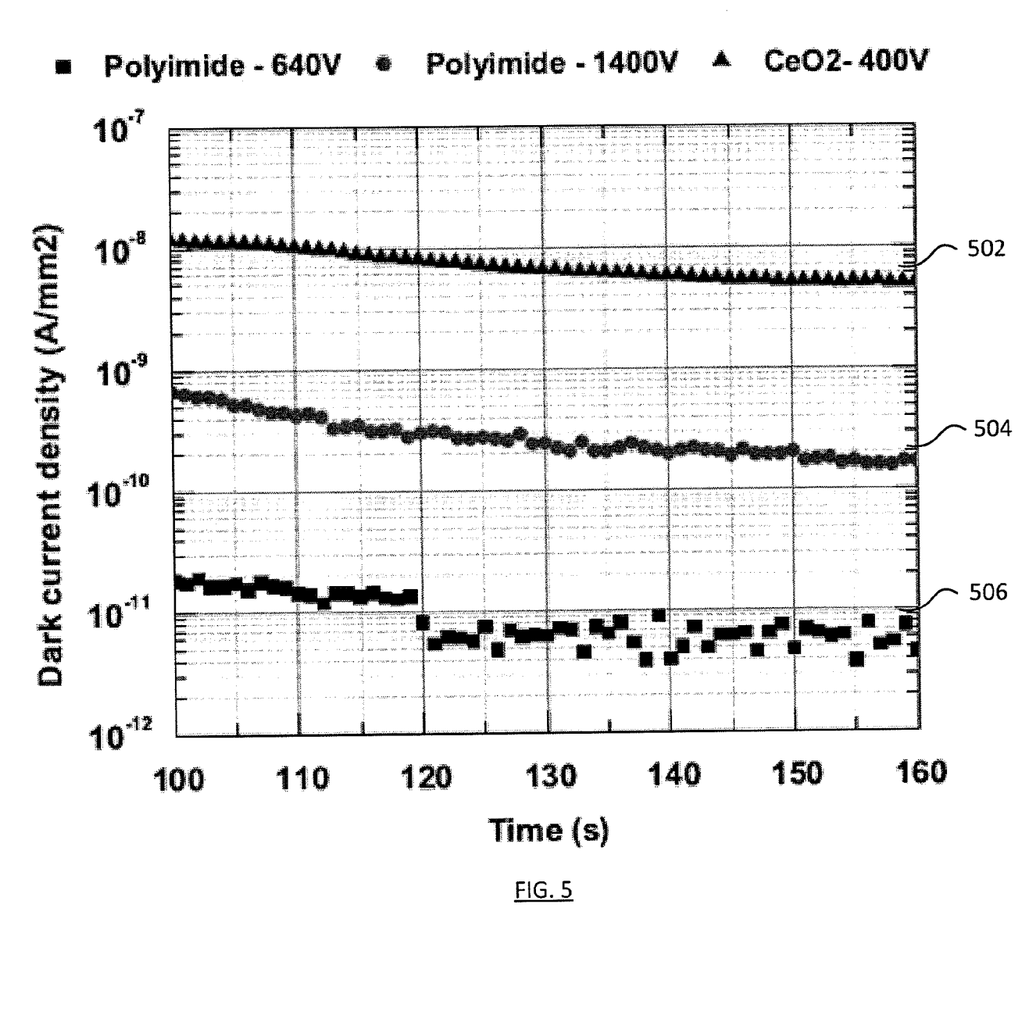
FIG. 5 is a graph of dark current for photodetectors with and without a soft polymer layer.

FIG. 5 illustrates dark current for fabricated selenium photodetectors at different bias voltages. For comparison purposes, dark current is illustrated for structures where the soft polymer layer is replaced with 10 nm of cerium dioxide 502 (deposited using e-beam evaporation). From the results, it can be seen that using cerium dioxide as a single blocking contact is not sufficient to keep the dark current low at high bias voltages. However, a single polyimide layer 504, 506 is shown to maintain low dark current at even significantly high bias voltages.

Figure 6:
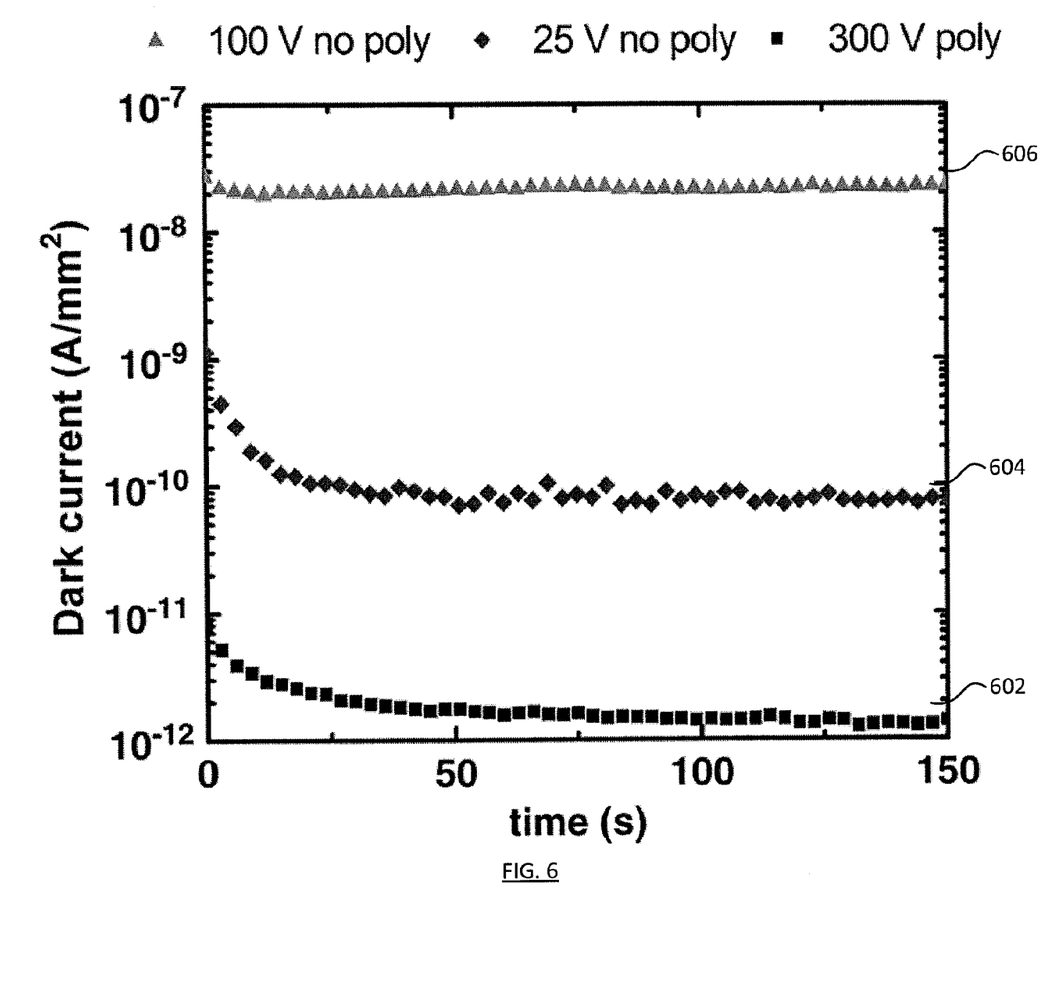
FIG. 6 is a graph of dark current for photodetectors with and without a soft polymer layer.

FIG. 6 illustrates dark current for different bias voltages of a device, or lateral photodetector, with 602 and without 604, 606 a soft polymer blocking layer where the current has been divided by the area of the device (1×1 mm$^2$) to be independent of the device size. It is evident that the dark current is significantly reduced when using the soft polymer blocking layer. The peak simulated electric fields for the devices without a soft polymer blocking layer were 4 and 16 V/μm at a depth of 1 μm in the a-Se at biases of 25 and 100 V. The electric field was simulated to be 33 V/μm at a depth of 1 μm in the a-Se for a bias of 300 V when the blocking layer is present. Thus, the soft polymer blocking layer appears to reduce dark current while maintaining a high electric field in the amorphous material layer. At higher biases (e.g. 100 V and above), the device without a soft polymer blocking layer exhibits increasing dark current over time.

Figure 7:
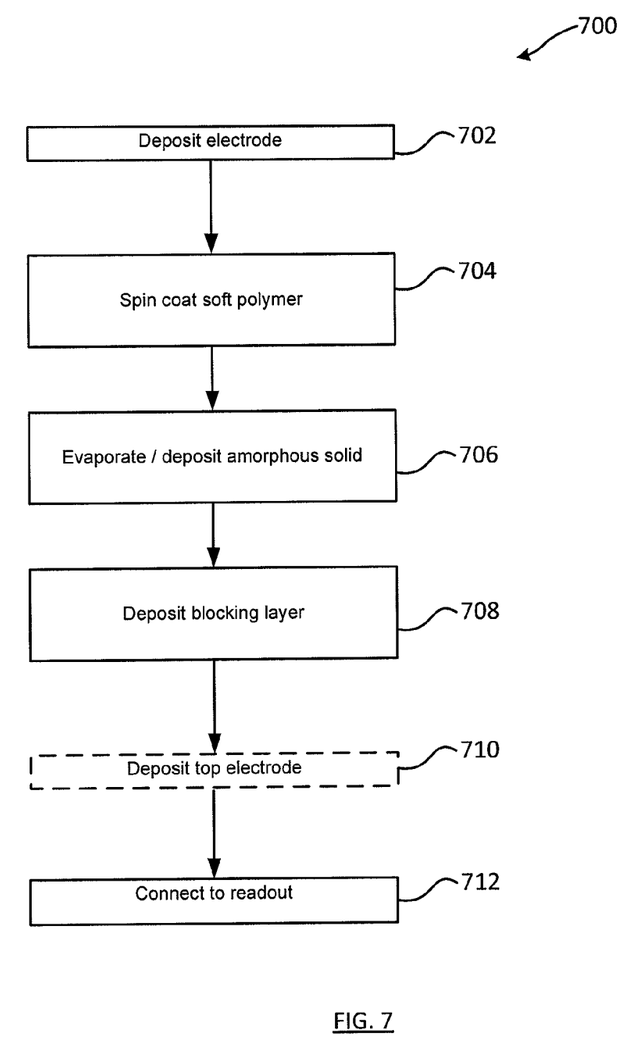
FIG. 7 is a flow chart of a method of manufacturing a photodetector, in accordance with an embodiment

FIG. 7 illustrates a method 700 for manufacturing a radiation detector, in accordance with an embodiment of the disclosure. In this embodiment, the method 700 may use the same capital equipment and semiconductor processes as existing large area semiconductor fabrication technology.

At 702, an electrode is deposited on a substrate layer. In embodiments where the radiation detector is a lateral photodetector, a pair of electrodes is deposited on the substrate layer. The substrate layer may be a pre-purchased item as these are readily available. In some cases, the electrode and the substrate may be integrated and seen as one component.

At 704, a soft polymer layer is deposited, either by spin-coating or thermal evaporation, ink-jet, or sprayed on to the bottom electrode. In embodiments where the radiation detector is a lateral photodetector, the soft polymer layer is deposited on the electrodes and the substrate layer. The goal of the soft polymer is to provide uniformity or a uniform surface to which the radiation detecting layer may be deposited. In many or most cases, the surface of the electrode is not smooth thereby leading to crystallization or other issues when the photodetector is in use. For example, a polyimide layer is deposited via a spin-coating process and subsequently baked on a commercially available ITO-glass substrate.

At 706, a radiation detecting material is evaporated or deposited on the soft polymer layer. For example a thick stabilized a-Se alloy layer (containing 0.2% As and 5 ppm Cl) may be evaporated onto the soft polymer layer or the polyimide coated ITO-glass. A thickness of the radiation detecting layer is selected based on the photo to dark current ratio as a function of electric field increasing with radiation detecting layer thickness.

At 708, a blocking layer may be deposited, such as by thermal evaporation or spin-coating onto the amorphous material layer. In embodiments where the blocking layer is TiO2 or CeO2 the blocking layer may be deposited on the radiation detecting layer by e-beam deposition. At 710, in embodiments where the radiation detector is a vertical photodetector, a top electrode is deposited on to either the blocking layer (if present) or the radiation detecting layer. For example, a thin gold top electrode is deposited on the a-Se layer. At 712, the assembled photodetector is connected to readout electronics.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A high electric field radiation detector comprising:
a first electrode;
a second electrode;
a radiation detecting layer; and
an insulating soft polymer layer below the radiation detecting layer and in contact with at least the first electrode.

2. The radiation detector of claim 1, wherein the radiation detector is in a vertical configuration; and
wherein the insulating soft polymer layer is deposited on the first electrode and the second electrode is deposited above the radiation detecting layer.

3. The radiation detector of claim 1, wherein the radiation detector is in a lateral configuration; and
wherein the insulating soft polymer layer is deposited on the first electrode and the second electrode.

4. The radiation detector of claim 1, wherein the radiation detecting layer is selected from any one of amorphous selenium, amorphous silicon, mercuric iodide, lead oxide, and an organic semiconductor.

5. The radiation detector of claim 1, wherein the insulating soft polymer layer comprises a polyimide material.

6. The radiation detector of claim 1 further comprising a blocking layer above the radiation detecting layer.

7. The radiation detector of claim 1 further comprising a substrate layer connected to the first electrode on a surface opposite the insulating soft polymer layer.

8. The radiation detector of claim 7 wherein the substrate layer is selected from any one of a thin film transistor array, a complementary metal-oxide semiconductor transistor array, a plastic layer, a steel layer, and a glass layer.

9. The radiation detector of claim 8 further comprising readout electronics connected to the substrate layer.

10. The radiation detector of claim 1, wherein said first electrode and said second electrode are spaced laterally apart; said insulating soft polymer layer in contact with said first electrode and said second electrode; and wherein said radiation detecting layer is not in contact with said first electrode and said second electrode.

11. A method of manufacturing a radiation detector, the method comprising:
    obtaining a radiation detecting layer;
    depositing an insulating soft polymer layer on at least one side of the radiation detecting layer;
    depositing a on one side of the insulating soft polymer layer; and
    depositing a second electrode on the radiation detecting layer on a side opposite of the insulating soft polymer layer.

12. The method of claim 11, wherein depositing the radiation detecting layer comprises depositing any one of amorphous selenium, amorphous silicon, mercuric iodide, lead oxide, and an organic semiconductor on the polymer layer.

13. The method of claim 11, wherein depositing the insulating soft polymer layer comprises depositing a polyimide material on the first electrode.

14. The method of claim 11, wherein depositing the insulating soft polymer layer comprises spin coating and baking the insulating soft polymer on the first electrode.

15. The method of claim 11, wherein depositing the second electrode above the radiation detecting layer comprises:
    evaporating or spin coating a blocking layer above the radiation detecting layer; and
    depositing the second electrode on the blocking layer.

16. The method of claim 11 further comprising:
    connecting the first electrode to a substrate layer; and
    connecting the substrate layer to readout electronics.

17. The method of claim 11 further comprising operating under a high electric field.

18. A method of manufacturing a radiation detector, the method comprising:
    obtaining a radiation detecting layer;
    depositing an insulating soft polymer layer on one side of the radiation detecting layer; and
    depositing a first electrode and a second electrode, the first and second electrode spaced laterally apart on the insulating soft polymer layer and the first and second electrodes not in contact with the radiation detecting layer.

19. The method of claim 18, wherein depositing the radiation detecting layer comprises depositing any one of amorphous selenium, amorphous silicon, mercuric iodide, lead oxide, and an organic semiconductor on the polymer layer.

20. The method of claim 18, wherein depositing the insulating soft polymer layer comprises depositing a polyimide material on the first electrode and the second electrode.

21. The method of claim 18, wherein depositing the insulating soft polymer layer comprises spin coating and baking the insulating soft polymer on the first electrode and the second electrode.

22. The method of claim 18 further comprising:
    evaporating or spin coating a blocking layer above the radiation detecting layer.

23. The method of claim 18 further comprising:
    connecting the first electrode and the second electrode to a substrate layer; and
    connecting the substrate layer to readout electronics.

24. The method of claim 18 further comprising operating under a high electric field.

25. A high electric field radiation detector comprising:
    a first electrode;
    a second electrode;
    a radiation detecting layer; and
    an insulating soft polymer layer in contact with the radiation detecting layer and in contact with at least the first electrode.

* * * * *

UNITED STATES PATENT AND TRADEMARK OFFICE
CERTIFICATE OF CORRECTION

| | | |
|---|---|---|
| PATENT NO. | : 9,269,838 B2 | Page 1 of 1 |
| APPLICATION NO. | : 14/363859 | |
| DATED | : February 23, 2016 | |
| INVENTOR(S) | : Karim et al. | |

It is certified that error appears in the above-identified patent and that said Letters Patent is hereby corrected as shown below:

On the title page item [57], line 2 and 3, delete each occurrence of the word "polvmer" and insert --polymer--.

In the claims

Column 9, line 22, claim 11 insert --first electrode-- after 'depositing a'.

Signed and Sealed this
Third Day of May, 2016

Michelle K. Lee
*Director of the United States Patent and Trademark Office*